United States Patent
Narematsu et al.

(10) Patent No.: US 11,901,146 B2
(45) Date of Patent: Feb. 13, 2024

(54) RELAY DRIVE CONTROL DEVICE, CONTROL METHOD, AND STORAGE MEDIUM

(71) Applicant: TOYOTA JIDOSHA KABUSHIKI KAISHA, Toyota (JP)

(72) Inventors: Tomohiro Narematsu, Nisshin (JP); Akira Umemoto, Nagakute (JP); Takuya Itoh, Toyota (JP); Yasuyuki Morishita, Owariasahi (JP); Yu Shimizu, Nagakute (JP); Fumiyoshi Kuribara, Toyota (JP); Ippei Takesue, Nisshin (JP); Daiki Takayama, Toyota (JP); Tomoya Aoki, Okazaki (JP); Daisuke Kamikihara, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/159,790

(22) Filed: Jan. 26, 2023

(65) Prior Publication Data
US 2023/0298837 A1    Sep. 21, 2023

(30) Foreign Application Priority Data
Mar. 16, 2022   (JP) .................... 2022-041637

(51) Int. Cl.
| | |
|---|---|
| *H01H 47/02* | (2006.01) |
| *H01H 47/22* | (2006.01) |
| *H01H 47/00* | (2006.01) |
| *H02J 7/14*  | (2006.01) |
| *H02M 3/16*  | (2006.01) |

(52) U.S. Cl.
CPC .......... *H01H 47/22* (2013.01); *H01H 47/002* (2013.01); *H02J 7/14* (2013.01); *H02M 3/16* (2013.01); *H01H 2231/026* (2013.01)

(58) Field of Classification Search
CPC ................. H01H 47/22; H01H 47/002; H01H 2231/026; H02J 7/14; H02M 3/16
See application file for complete search history.

(56) References Cited

U.S. PATENT DOCUMENTS

| | | | | |
|---|---|---|---|---|
| 2017/0233000 | A1* | 8/2017 | Fujimoto | B62D 5/0463 |
| | | | | 701/41 |
| 2017/0274785 | A1* | 9/2017 | Kuribara | B60L 58/12 |
| 2019/0296541 | A1* | 9/2019 | Mensch | B60L 3/04 |
| 2020/0144840 | A1 | 5/2020 | Masuda | |
| 2023/0230788 | A1* | 7/2023 | Miura | B60L 3/00 |
| | | | | 361/211 |

FOREIGN PATENT DOCUMENTS

| | | |
|---|---|---|
| EP | 3 699 013 A2 | 8/2020 |
| JP | 2009-136110 A | 6/2009 |
| JP | 2014-79121 A | 5/2014 |
| JP | 5621648 B2 | 11/2014 |

\* cited by examiner

*Primary Examiner* — Jared Fureman
*Assistant Examiner* — Esayas G Yeshaw
(74) *Attorney, Agent, or Firm* — Oblon, McClelland, Maier & Neustadt, L.L.P.

(57) ABSTRACT

A relay drive control device is configured to control drive of a relay for connecting a battery mounted on a vehicle and an external power supply. The relay drive control device includes a controller configured to, when driving the relay, supply an output voltage of the battery to the relay after increasing the output voltage to a voltage value at which the relay is drivable.

11 Claims, 6 Drawing Sheets

RELAY DRIVE CONTROL DEVICE, CONTROL METHOD, AND STORAGE MEDIUM

CROSS-REFERENCE TO RELATED APPLICATION

This application claims priority to Japanese Patent Application No. 2022-041637 filed on Mar. 16, 2022, incorporated herein by reference in its entirety.

BACKGROUND

1. Technical Field

The present disclosure relates to a relay drive control device, a control method, and a storage medium. The relay drive control device is configured, for example, to control drive of a relay for connecting a battery mounted on a vehicle and an external power supply.

2. Description of Related Art

Japanese Unexamined Patent Application Publication No. 2014-079121 (JP 2014-079121 A) discloses a power storage system including a power storage device constituted by a plurality of single cells connected in series, a relay that switches the status of connection and disconnection between the power storage device and a load, and a controller that controls drive of the relay by energization or de-energization of a coil portion. In this power storage system, the controller dynamically controls a voltage to be supplied to the coil portion based on the state of the relay, thereby driving the relay appropriately.

SUMMARY

To drive the relay, the power storage system described in JP 2014-079121 A requires, for example, a temperature sensor for deriving a drive voltage based on the state of the relay, and a plurality of switches for extracting the derived drive voltage from the power storage device constituted by the single cells connected in series. Therefore, the cost and scale (size and weight) of the power storage system increase.

The present disclosure provides a relay drive control device, a control method, and a storage medium in which the relay can be driven while suppressing the increase in the cost and scale (size and weight).

A first aspect of the present disclosure relates to a relay drive control device configured to control drive of a relay for connecting a battery mounted on a vehicle and an external power supply. The relay drive control device includes a controller configured to, when driving the relay, supply an output voltage of the battery to the relay after increasing the output voltage to a voltage value at which the relay is drivable.

In the first aspect, the relay drive control device may include a voltage converter configured to output the output voltage converted into a drive voltage to the controller. The output voltage may be input from the battery. The controller may be configured to, when driving the relay, control the voltage converter to increase the drive voltage input from the voltage converter to a first voltage value at which the relay is drivable. The controller may be configured to supply the drive voltage to the relay when the relay is to be driven and the drive voltage reaches the first voltage value.

In the first aspect, the controller may be configured to, when the controller has started to control the voltage converter to increase the drive voltage to the first voltage value in a situation in which the relay is to be driven and then a predetermined period has elapsed before the drive voltage reaches the first voltage value, supply the drive voltage to the relay at a timing when the predetermined period has elapsed.

In the first aspect, the controller may be configured to control the voltage converter to reduce the drive voltage to a second voltage value after the relay has been driven by supplying the drive voltage to the relay.

In the first aspect, the first voltage value may be a voltage value at which the relay is drivable at an upper limit value of a predetermined temperature range in which use of the relay is permitted.

In the first aspect, the second voltage value may be a voltage value at which the relay that is being driven is not switched to an open state.

In the first aspect, the controller may be configured to determine whether the relay is drivable based on states of the battery and the voltage converter.

In the first aspect, the controller may be configured to change, based on information related to a temperature of the relay, at least one of the predetermined period and a rate of increase in the drive voltage to the first voltage value.

In the first aspect, the external power supply may be external charging equipment to be plugged into the vehicle to supply electric power to the vehicle.

A second aspect of the present disclosure relates to a control method to be executed by a computer of a relay drive control device configured to control drive of a relay for connecting a battery mounted on a vehicle and an external power supply. The control method includes determining whether to drive the relay, increasing, when driving the relay, an output voltage of the battery to a drive voltage at which the relay is drivable, and supplying the drive voltage to the relay when the output voltage reaches the drive voltage.

A third aspect of the present disclosure relates to a non-transitory storage medium storing instructions that are executable by one or more processors of a computer of a relay drive control device and that cause the one or more processors to perform functions. The relay drive control device is configured to control drive of a relay for connecting a battery mounted on a vehicle and an external power supply. The functions include determining whether to drive the relay, increasing, when driving the relay, an output voltage of the battery to a drive voltage at which the relay is drivable, and supplying the drive voltage to the relay when the output voltage reaches the drive voltage.

According to the first aspect, the second aspect, and the third aspect of the present disclosure, the voltage for driving the relay is controlled by using the existing device configuration. Thus, the relay can appropriately be driven while suppressing the increase in the cost and scale (size and weight) of the device.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

When charging an onboard battery by using an external power supply, the relay drive control device of the present disclosure performs control for increasing a voltage for driving a charging relay that switches ON/OFF states of charging up to a voltage value at which the relay can be driven even at a high temperature. With this control, the charging relay can be driven appropriately.

An embodiment of the present disclosure will be described below in detail with reference to the drawings.

Embodiment

Configuration

Figure 1:
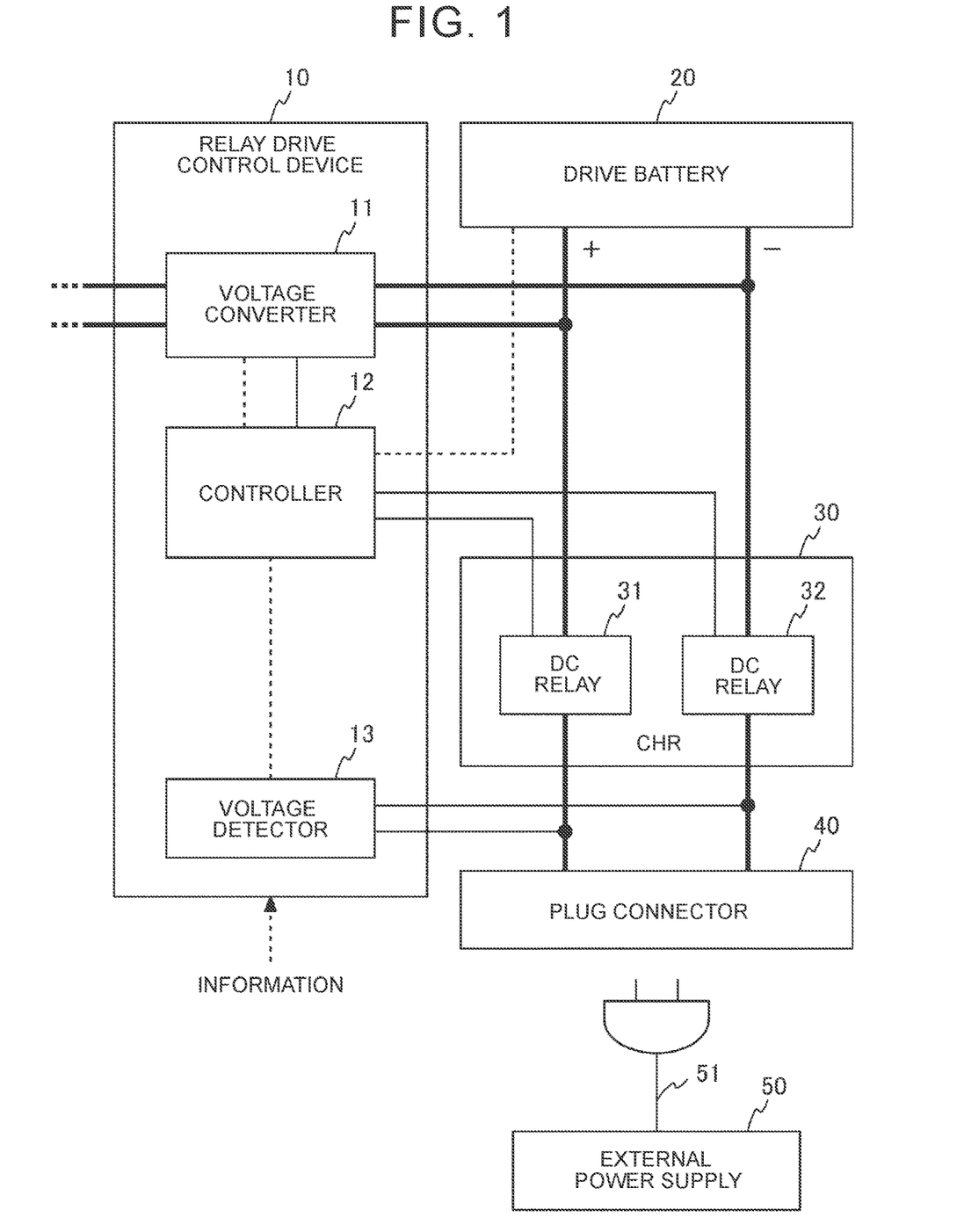
FIG. 1 is a functional block diagram of a relay drive control device and its peripheral components according to an embodiment of the present disclosure.

FIG. 1 is a functional block diagram of a relay drive control device 10 and its peripheral components according to the embodiment of the present disclosure. Functional blocks illustrated in FIG. 1 include the relay drive control device 10, a drive battery 20, a charge relay (CHR) 30, and a plug connector 40. In FIG. 1, a wide continuous line indicates a connection line mainly for power supply, a narrow continuous line indicates a connection line mainly for voltage supply, and a dashed line indicates a connection line for control.

The relay drive control device 10, the drive battery 20, the charge relay 30, and the plug connector 40 are mounted on a vehicle (electrified vehicle) such as a plug-in hybrid electric vehicle (PHEV) or a battery electric vehicle (BEV) that uses an electric motor as a power source and can charge a battery by using an external power supply 50. The vehicle including the relay drive control device 10, the drive battery 20, the charge relay 30, and the plug connector 40 can connect the external power supply 50 to the plug connector 40 via a charging cable 51. The external power supply 50 described in the present embodiment is external charging equipment for supplying direct current (DC) power to the vehicle.

The drive battery 20 is a rechargeable secondary battery such as a lithium-ion battery, and is a high-voltage battery that supplies electric power to so-called main devices (not shown) such as a starter motor and a traveling electric motor mounted on the vehicle. The drive battery 20 can receive (can be charged with) electric power from the external power supply 50 via the charge relay 30 and the plug connector 40. The drive battery can supply electric power to the relay drive control device 10 via a system main relay (SMR) (not shown).

The charge relay (CHR) 30 is a switching element that is provided between the drive battery 20 and the plug connector 40 and is used for controlling connection and disconnection of a power path (power supply path) for charging the drive battery 20 by using the external power supply 50. The charge relay 30 includes a DC relay 31 inserted into a power supply line on a positive (+) side of the power path (hereinafter referred to as "positive DC relay 31"), and a DC relay 32 inserted into a power supply line on a negative (−) side of the power path (hereinafter referred to as "negative DC relay 32"). The positive DC relay 31 and the negative DC relay 32 can independently switch, based on drive voltages supplied from a controller 12 of the relay drive control device 10 described later, a drive state (ON operation) in which terminals are electrically connected and an open state (OFF operation) in which the terminals are electrically disconnected. Each of the positive DC relay 31 and the negative DC relay 32 may be a mechanical relay that brings contacts into a conductive state by applying a voltage to a coil portion and causing a current to flow. In the following description, when the positive DC relay 31 and the negative DC relay 32 are controlled into the same operation state in conjunction with each other, this operation state is expressed as the operation state of the charge relay 30.

The plug connector 40 is a power interface for connecting the vehicle to the external power supply 50 via the charging cable 51. When the vehicle is connected to the external power supply 50 via the charging cable 51, the drive battery 20 is charged with electric power supplied from the external power supply 50 during a period in which the charge relay 30 is in the drive state.

The relay drive control device 10 is a device for controlling the charging of the drive battery 20 by controlling the charge relay 30. In addition, the relay drive control device 10 can control an electric power balance of the drive battery 20 and an auxiliary battery (not shown) that supplies electric power to auxiliary devices (not shown). The relay drive control device 10 according to the present embodiment includes a voltage converter 11, the controller 12, and a voltage detector 13.

The voltage converter 11 generates a drive voltage for driving the charge relay 30 based on an output voltage of the drive battery 20, and supplies the generated drive voltage to the controller 12. That is, the voltage converter 11 functions as a power converter that converts electric power having a battery-specified voltage stored in the drive battery 20 into electric power having the drive voltage. The voltage converter 11 is typically a DC-DC converter that can generate a drive voltage having a voltage value specified by the controller 12 and output it to the controller 12. The voltage converter 11 can convert, for example, electric power stored in the drive battery 20 into electric power having a predetermined voltage, and supply it to the auxiliary devices and the auxiliary battery.

The controller 12 controls the start and end of the charging of the drive battery 20 by switching the operation state of the charge relay 30 with the electric power of the drive voltage supplied from the voltage converter 11 based on the states of the drive battery 20 and the voltage converter 11 and output terminal voltages of the charge relay 30 that is detected by the voltage detector 13. The controller 12 can acquire the state of the drive battery 20 (voltage, current, temperature, etc.) from the functional unit or system that controls the drive battery 20. The controller 12 can instruct the voltage converter 11 to increase, keep, or reduce the voltage value of the drive voltage input from the voltage converter 11. The controller 12 can diagnose an abnormality such as a failure of the charge relay 30. Processes to be executed by the controller 12 will be described later.

The voltage detector 13 detects a potential difference between the output terminal voltage of the positive DC relay 31 and the output terminal voltage of the negative DC relay 32 in the charge relay 30. The voltage detector 13 is a detection element such as a voltage sensor. The potential difference between the output terminal voltage of the positive DC relay 31 and the output terminal voltage of the negative DC relay 32 that is detected by the voltage detector 13 is output to the controller 12. The voltage detector 13 may be provided in a component other than the relay drive control device 10.

A part or all of the controller 12 can be configured by an electronic control unit (HV_ECU, charging ECU, etc.) including a processor, a memory, an input/output interface, and the like as typified by a microcomputer. The electronic control unit can implement a part or all of the functions described above by the processor reading and executing programs stored in the memory.

Control

Next, control to be executed by the relay drive control device 10 according to the present embodiment will be described with further reference to FIGS. 2 to 6. The control to be executed by the relay drive control device 10 can be represented by "DC charging control" for controlling the charging of the drive battery 20, "relay drive control" for controlling the operation state of the charge relay 30, and "relay diagnosis control" for diagnosing whether an abnormality occurs in the charge relay 30.

(1) DC Charging Control

Figure 2:
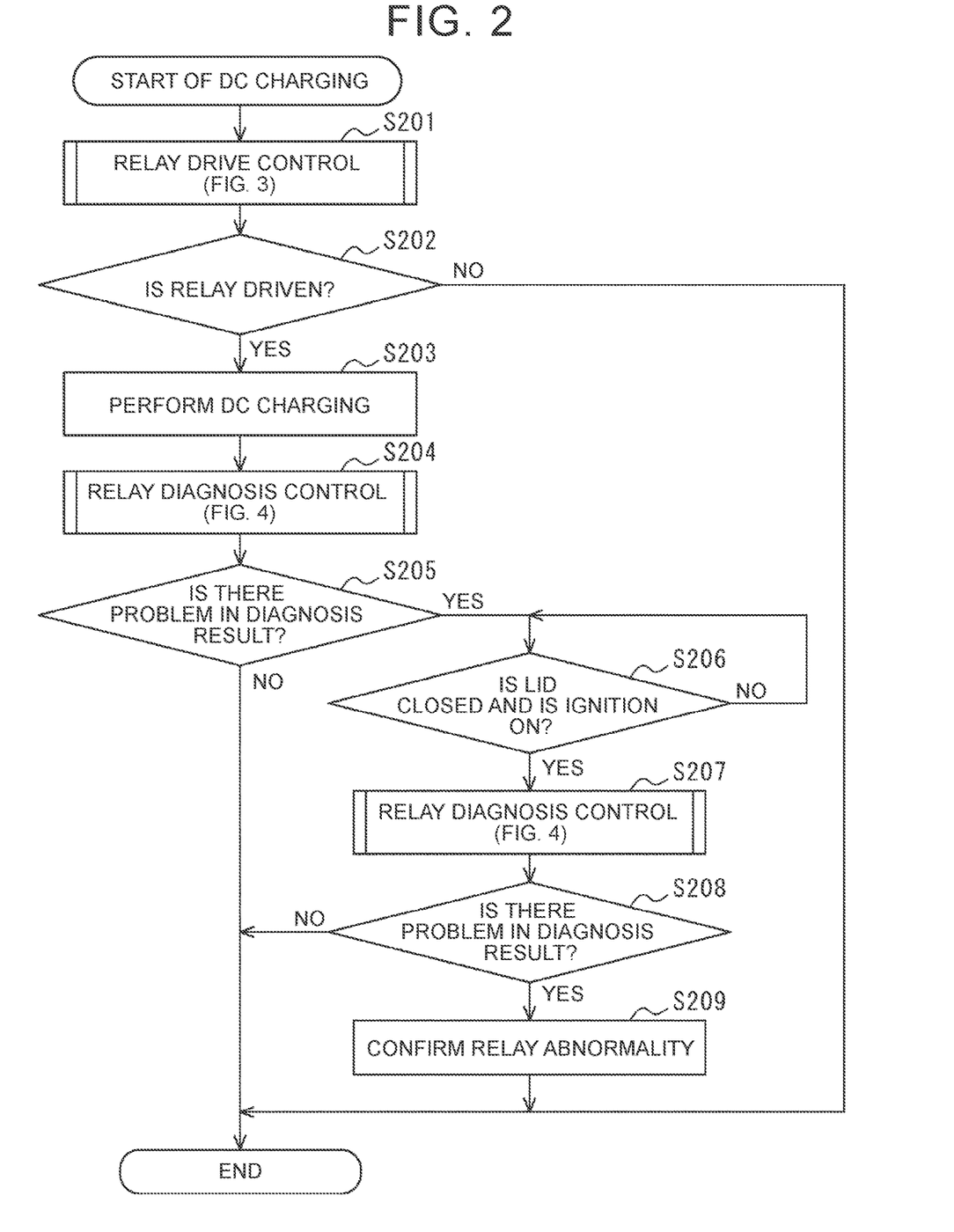
FIG. 2 is a processing flowchart of direct current (DC) charging control to be executed by the relay drive control device.

FIG. 2 is a flowchart showing a processing procedure of the DC charging control for the drive battery 20 using the external power supply 50 that is executed by the controller 12 of the relay drive control device 10. The DC charging control illustrated in FIG. 2 is started, for example, when the charging cable 51 of the external power supply 50 is connected to the plug connector 40.

Step S201

When performing the DC charging of the vehicle, the controller 12 performs the relay drive control to control the operation state of the charge relay 30. Details of the relay drive control will be described later with reference to FIG. 3. When the controller 12 performs the relay drive control, the process proceeds to Step S202.

Step S202

The controller 12 determines whether the charge relay 30 is driven by the relay drive control. This determination can be made based on the potential difference between the output terminal voltage of the positive DC relay 31 and the output terminal voltage of the negative DC relay 32 that is detected by the voltage detector 13.

When the controller 12 determines that the charge relay 30 is driven (Step S202: YES), the process proceeds to Step S203. When the controller 12 determines that the charge relay 30 is not driven (Step S202: NO), the DC charging control is terminated without performing the DC charging.

Step S203

The controller 12 performs the DC charging control to charge the drive battery 20 with electric power of the external power supply 50. A known charging method can be used for the DC charging. When the DC charging is performed by the controller 12 and is finished, the process proceeds to Step S204. When the DC charging is finished, the charge relay 30 is controlled into the open state.

Step S204

The controller 12 performs the relay diagnosis control to diagnose whether an abnormality occurs in the charge relay 30. Details of the relay diagnosis control will be described later with reference to FIG. 4. When the controller 12 performs the relay diagnosis control, the process proceeds to Step S205.

Step S205

The controller 12 determines whether there is a problem in a result of the diagnosis of the charge relay 30. More specifically, the relay drive control device 10 determines whether the charge relay 30 is determined to be normal.

When the controller 12 determines that there is no problem in the result of the diagnosis of the charge relay 30 (Step S205: NO), the DC charging control is terminated. When the controller 12 determines that there is a problem in the result of the diagnosis of the charge relay 30 (Step S205: YES), the process proceeds to Step S206.

Step S206

The controller 12 determines whether a charging lid is closed with the charging cable 51 pulled out from the plug connector 40 and an ignition switch of the vehicle is turned ON (IG-ON). This determination can be made by the controller 12 acquiring information on, for example, the opening or closing of the charging lid and an ignition switch signal from predetermined onboard devices. Only when the controller 12 determines that the charging lid is closed and the ignition switch is turned ON (Step S206: YES), the process proceeds to Step S207.

Step S207

The controller 12 performs the relay diagnosis control again to diagnose again whether an abnormality occurs in the charge relay 30. This relay diagnosis control is the same process as the relay diagnosis control in Step S204. When the controller 12 performs the relay diagnosis control again, the process proceeds to Step S208. This re-diagnosis of an abnormality of the charge relay 30 may be repeated multiple times by setting a time limit.

Step S208

The controller 12 determines whether there is a problem in a result of the diagnosis of the charge relay 30. More specifically, the relay drive control device 10 determines whether the charge relay 30 is determined to be normal.

When the controller 12 determines that there is no problem in the result of the diagnosis of the charge relay 30 (Step S208: NO), the DC charging control is terminated. When the controller 12 determines that there is a problem in the result of the diagnosis of the charge relay 30 (Step S208: YES), the process proceeds to Step S209.

Step S209

The controller 12 confirms that the charge relay 30 is in an abnormal state. When the controller 12 confirms that the charge relay 30 is abnormal, the DC charging control is terminated.

For example, a user of the vehicle may be notified about the determination result that the charge relay 30 is abnormal. The notification that the charge relay 30 is abnormal may be given to the user or the like, for example, by using a function of displaying the state of the charging equipment (such as a light-emitting diode (LED) lamp).

Through the DC charging control, control is made as to whether to perform the DC charging of the drive battery 20 using the external power supply 50, and determination is made, for the next DC charging, as to whether the charge relay 30 is normal or abnormal.

(2) Relay Drive Control

Figure 3:
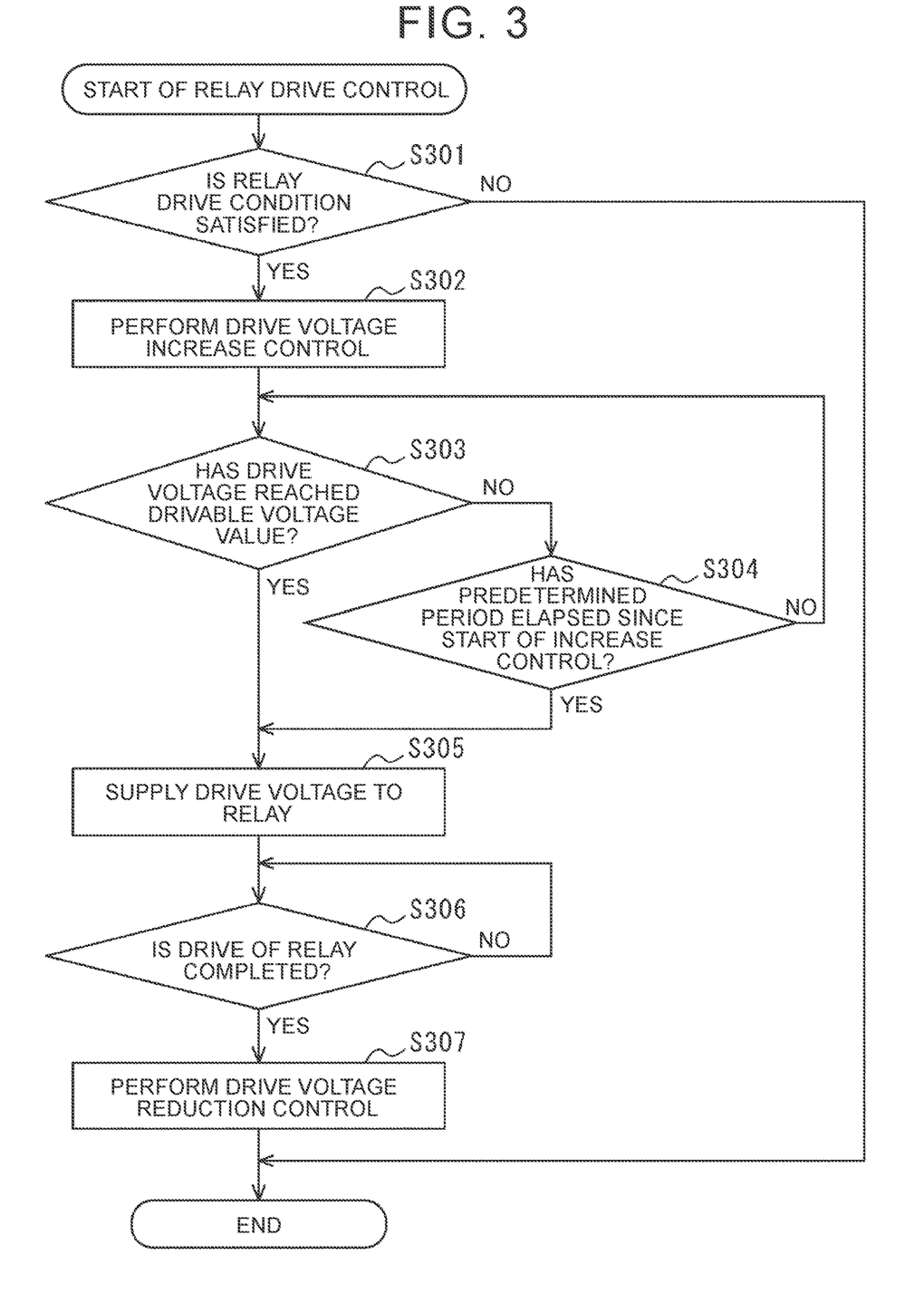
FIG. 3 is a processing flowchart of relay drive control to be executed by the relay drive control device.

FIG. 3 is a flowchart showing a processing procedure of the relay drive control to be executed by the controller 12 of the relay drive control device 10 in Step S201 of FIG. 2. It is assumed that the state of the charge relay 30 before the start of the relay drive control is the open state (OFF operation) in which the terminals are electrically disconnected.

Step S301

The controller 12 determines whether a "relay drive condition" for driving the charge relay 30 to permit the charging of the drive battery 20 from the external power supply 50 is satisfied. Examples of the relay drive condition include a condition that the drive battery 20 does not have a high-voltage abnormality, a condition that the drive battery 20 does not have a high-temperature abnormality, a condition that the output of the voltage converter 11 does not have a low-voltage abnormality, a condition that the output of the voltage converter 11 does not have a high-voltage abnormality, and a condition that the voltage converter 11 does not have a high-temperature abnormality. Thus, the relay drive condition is that all the functions of the drive battery 20 and the voltage converter 11 exhibit predetermined normal values. Whether the relay drive condition is satisfied may be determined based on results given from a system (not shown) that controls and manages the drive battery 20 and a system (not shown) that controls and manages the voltage converter 11, or may be determined by the controller 12 based on physical quantities (voltages, currents, temperatures, etc.) detected or acquired from the drive battery 20 and the voltage converter 11.

When the controller 12 determines that the relay drive condition of the charge relay 30 is satisfied (Step S301: YES), the process proceeds to Step S302. When the controller 12 determines that the relay drive condition of the charge relay 30 is not satisfied (Step S301: NO), the relay drive control is terminated.

When the relay drive control is terminated without satisfying the relay drive condition of the charge relay 30, the user of the vehicle may be notified that an abnormality has occurred in any of the functions of the drive battery 20 and the voltage converter 11. The notification that the external charging cannot be performed may be given to the user or the like, for example, by using the function of displaying the state of the charging equipment (such as an LED lamp).

Step S302

The controller 12 performs control for increasing the drive voltage input from the voltage converter 11. Specifically, the controller 12 performs control for increasing the drive voltage from a current voltage value to a predetermined first voltage value (described later). The controller 12 increases the voltage value of the drive voltage output by the voltage converter 11 by changing a command value of the output voltage for the voltage converter 11. The rate of increase in the voltage value is not limited, but may be changed based on information related to the temperature of the charge relay 30, such as a duration of the charging in the previous DC charging control, a period elapsed since the completion of the previous DC charging control, and an outside air temperature. For example, when the period elapsed since the completion of the previous DC charging control is short or when the outside air temperature is high, it is estimated that the temperature of the charge relay 30 is relatively higher than normal. Thus, the rate of increase in the voltage value may be increased. With this change, the charge relay 30 can be driven at an early timing. When the controller 12 performs the control for increasing the drive voltage, the process proceeds to Step S303.

Step S303

The controller 12 determines whether the drive voltage input from the voltage converter 11 has reached the first voltage value. The first voltage value can be a drivable voltage value at which the charge relay 30 can be driven at an upper limit value of a predetermined temperature range in which the use of the charge relay 30 is permitted. As described above, in the mechanical relay, a working voltage that is an operating voltage increases as the temperature of the coil portion increases. Therefore, the drivable voltage value that is the first voltage value in the present embodiment is set to a voltage value at which the charge relay 30 can be driven even in a highest-temperature state assumed within the operation range in consideration of various voltage drops in a supply path (including a wire harness).

When the controller 12 determines that the drive voltage has reached the drivable voltage value (Step S303: YES), the process proceeds to Step S305. When the controller 12 determines that the drive voltage has not reached the drivable voltage value (Step S303: NO), the process proceeds to Step S304.

Step S304

The controller 12 determines whether a predetermined period has elapsed since the drive voltage increase control was started. When the temperature of the charge relay is low, the charge relay 30 can be driven even if the drive voltage is not the drivable voltage value. Therefore, this determination is made for the purpose of driving the charge relay 30 before the drive voltage reaches the drivable voltage value when it takes a long period for the drive voltage increase control. Thus, the predetermined period is arbitrarily set depending on the purpose, such as a period during which the delay in the drive of the charge relay 30 is permitted. Further, the predetermined period may be changed based on the information related to the temperature of the charge relay 30, such as a duration of the charging in the previous DC charging control, a period elapsed since the completion of the previous DC charging control, and an outside air temperature. For example, when the period elapsed since the completion of the previous DC charging control is short or when the outside air temperature is high, it is estimated that the temperature of the charge relay 30 is relatively higher than normal. Thus, the predetermined period may be reduced. With this change, the charge relay 30 can be driven at an early timing.

When the controller 12 determines that the predetermined period has elapsed since the drive voltage increase control was started (Step S304: YES), the process proceeds to Step S305. When the controller 12 determines that the predetermined period has not elapsed since the drive voltage increase control was started (Step S304: NO), the process proceeds to Step S303.

Step S305

The controller 12 supplies (electric power of) the drive voltage to the charge relay 30. When the drive voltage has reached the drivable voltage value in Step S303, the controller 12 supplies the drivable voltage value to the charge relay 30 as the drive voltage. When the predetermined period has elapsed in Step S304 before the drive voltage reaches the drivable voltage value, the controller 12 supplies a current voltage value output by the voltage converter 11 to the charge relay 30 as the drive voltage. When the controller 12 supplies (the electric power of) the drive voltage to the charge relay 30, the process proceeds to Step S306.

Step S306

The controller 12 determines whether the drive of the charge relay 30 is completed. More specifically, the controller 12 determines whether each of the positive DC relay 31 and the negative DC relay 32 is in the drive state in which the terminals are electrically connected. This determination can be made based on the potential difference between the output terminal voltage of the positive DC relay 31 and the output terminal voltage of the negative DC relay 32 that is acquired from the voltage detector 13. More specifically, when the potential difference between the two output terminal voltages has reached the voltage supplied from the external power supply 50 (or the voltage of the drive battery 20), determination can be made that the drive of the charge relay 30 is completed.

When the controller 12 determines that the drive of the charge relay 30 is completed (Step S306: YES), the process proceeds to Step S307. When the controller 12 determines that the drive of the charge relay 30 is not completed (Step S306: NO), the controller 12 waits until the charge relay 30 is driven.

Step S307

The controller 12 performs control for reducing the drive voltage input from the voltage converter 11. Specifically, the controller 12 performs control for reducing the drive voltage from a current voltage value to a predetermined second voltage value. As a general characteristic of the mechanical relay, the value of an open-circuit voltage that is a non-operating voltage is lower than the value of the working voltage that is the operating voltage. Therefore, the second voltage value can be set to a voltage value higher than the open-circuit voltage so that the charge relay 30 can keep its drive state. The controller 12 reduces the drive voltage output by the voltage converter 11 by changing the command value of the output voltage for the voltage converter 11. When the controller 12 performs the control for reducing the drive voltage, the relay drive control is terminated.

Through the relay drive control, it is possible to perform the DC charging of the drive battery 20 using the external power supply 50 by appropriately driving the charge relay 30 while suppressing the increase in the cost and scale (size and weight) of the relay drive control device 10.

(3) Relay Diagnosis Control

Figure 4:
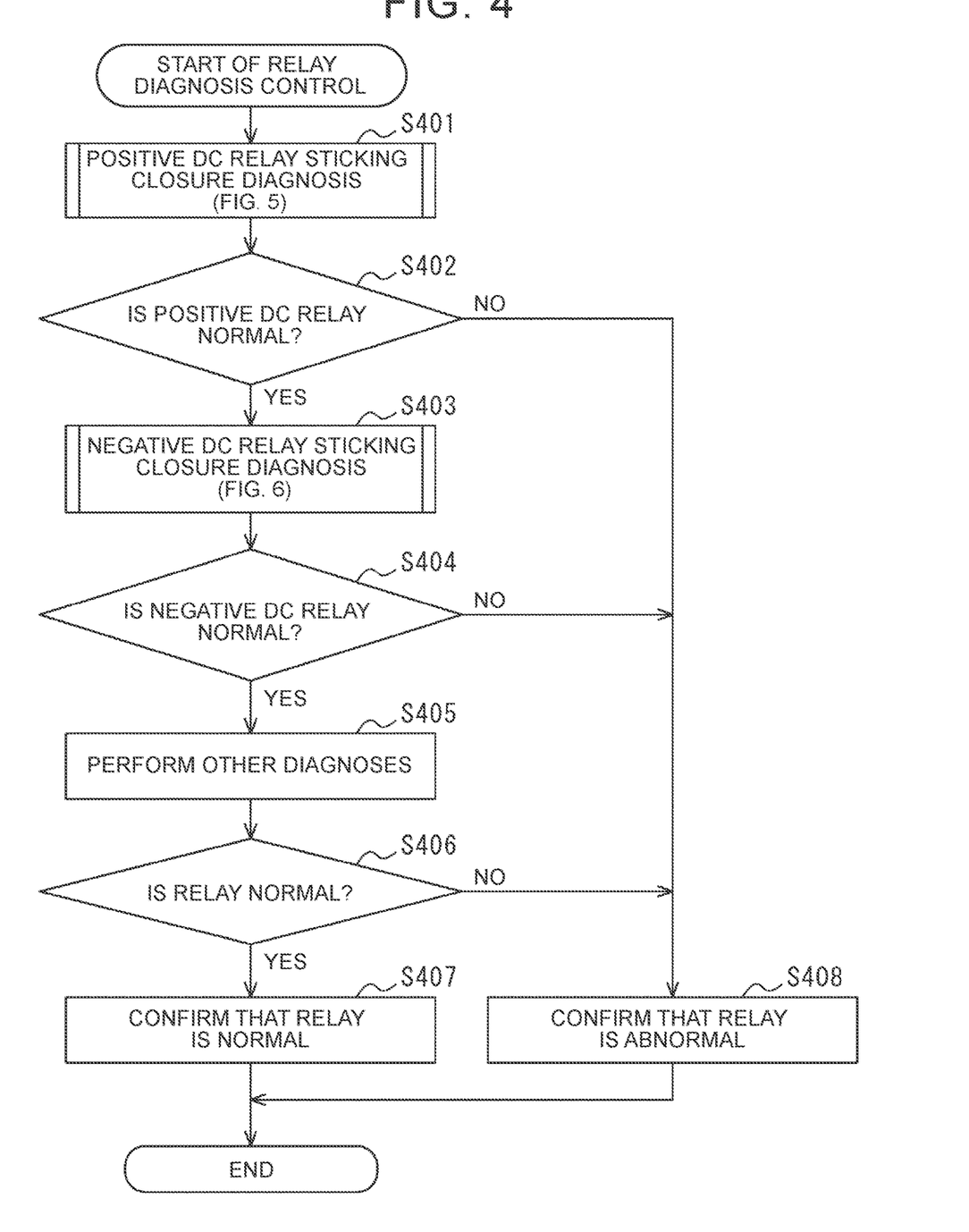
FIG. 4 is a processing flowchart of relay diagnosis control to be executed by the relay drive control device.

FIG. 4 is a flowchart showing a processing procedure of the relay diagnosis control to be executed by the controller 12 of the relay drive control device 10 in Steps S204 and S207 of FIG. 2. It is assumed that the power supply from the external power supply 50 to the plug connector 40 is stopped when the relay diagnosis control is performed.

Step S401

The controller 12 performs positive DC relay sticking closure diagnosis. More specifically, the controller 12 diagnoses whether the contacts of the positive DC relay 31 are stuck. Details of the positive DC relay sticking closure diagnosis will be described later with reference to FIG. 5. When the controller 12 performs the positive DC relay sticking closure diagnosis, the process proceeds to Step S402.

Step S402

The controller 12 determines whether the positive DC relay 31 is determined to be normal through the positive DC relay sticking closure diagnosis.

When the controller 12 determines that the positive DC relay 31 is determined to be normal (Step S402: YES), the process proceeds to Step S403. When the controller 12 determines that the positive DC relay 31 is not determined to be normal (Step S402: NO), the process proceeds to Step S408.

Step S403

The controller 12 performs negative DC relay sticking closure diagnosis. More specifically, the controller 12 diagnoses whether the contacts of the negative DC relay 32 are stuck. Details of the negative DC relay sticking closure diagnosis will be described later with reference to FIG. 6.

When the controller 12 performs the negative DC relay sticking closure diagnosis, the process proceeds to Step S404.

Step S404

The controller 12 determines whether the negative DC relay 32 is determined to be normal through the negative DC relay sticking closure diagnosis.

When the controller 12 determines that the negative DC relay 32 is determined to be normal (Step S404: YES), the process proceeds to Step S405. When the controller 12 determines that the negative DC relay 32 is not determined to be normal (Step S404: NO), the process proceeds to Step S408.

Step S405

The controller 12 performs other diagnoses necessary for determining the state of the charge relay 30 in addition to the DC relay sticking closure diagnosis. When the controller 12 performs the other diagnoses, the process proceeds to Step S406.

The process of Steps S401 and S402, the process of Steps S403 and S404, and the process of Step S405 may be performed in different order. If there is no other diagnosis, the process of Step S405 may be omitted.

Step S406

The controller 12 determines whether the charge relay 30 is determined to be normal, that is, whether both the positive DC relay 31 and the negative DC relay 32 are determined to be normal.

When the controller 12 determines that the charge relay 30 is determined to be normal (Step S406: YES), the process proceeds to Step S407. When the controller 12 determines that the charge relay 30 is not determined to be normal (Step S406: NO), the process proceeds to Step S408.

Step S407

The controller 12 confirms the determination that the charge relay 30 is normal. When the controller 12 confirms that the charge relay 30 is normal, the relay diagnosis control is terminated.

Step S408

The controller 12 confirms the determination that the charge relay 30 is abnormal. When the controller 12 confirms that the charge relay 30 is abnormal, the relay diagnosis control is terminated.

Through the relay diagnosis control, it is possible to predetermine whether the charging can be performed normally in the next DC charging control for the drive battery using the external power supply 50.

(4) Positive DC Relay Sticking Closure Diagnosis

Figure 5:
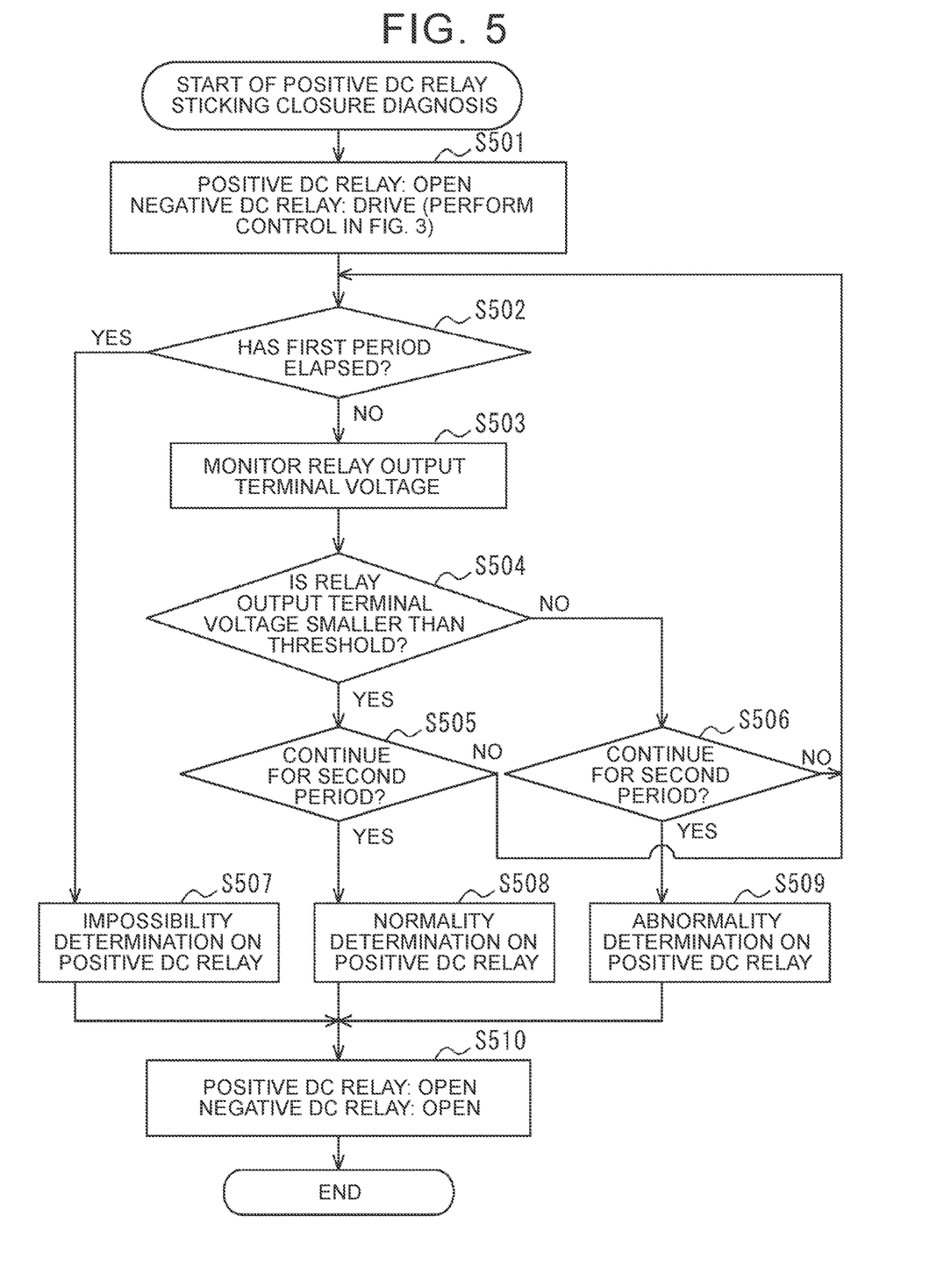
FIG. 5 is a processing flowchart of positive DC relay sticking closure diagnosis.

The positive DC relay sticking closure diagnosis to be performed in Step S401 of FIG. 4 will be described with further reference to FIG. 5. In the positive DC relay sticking closure diagnosis, diagnosis is made as to whether so-called sticking closure in which the contacts are fused and stuck in the electrically conductive state has occurred in the positive DC relay 31.

Step S501

The controller 12 controls the positive DC relay 31 into the open state, and controls the negative DC relay 32 into the drive state. During this control, the controller 12 performs the relay drive control (FIG. 3) only for the negative DC relay 32 in the drive state. When the controller 12 controls the positive DC relay 31 into the open state and controls the negative DC relay 32 into the drive state, the process proceeds to Step S502.

Step S502

The controller 12 determines whether a first period has elapsed since the operation states of the positive DC relay 31 and the negative DC relay 32 were controlled. This determination is made for the purpose of forcibly terminating the diagnosis when the state of the positive DC relay 31 is not stable and determination cannot be made as to whether it is normal or abnormal. Therefore, the first period may appropriately be set based on, for example, the performance of the charge relay 30 and the charging specifications of the vehicle.

When the controller 12 determines that the first period has elapsed since the operation states of the positive DC relay 31 and the negative DC relay 32 were controlled (Step S502: YES), the process proceeds to Step S507. When the controller 12 determines that the first period has not elapsed since the operation states of the positive DC relay 31 and the negative DC relay 32 were controlled (Step S502: NO), the process proceeds to Step S503.

Step S503

The controller 12 monitors the potential difference between the output terminal voltage of the positive DC relay 31 and the output terminal voltage of the negative DC relay 32. The potential difference between the two output terminal voltages can be acquired from the voltage detector 13. When the controller 12 monitors the potential difference between the two output terminal voltages, the process proceeds to Step S504.

Step S504

The controller 12 determines whether the potential difference between the output terminal voltage of the positive DC relay 31 and the output terminal voltage of the negative DC relay 32 is smaller than a predetermined threshold. This determination is made to determine whether the positive DC relay 31 is in the drive state or in the open state. Therefore, this threshold is set to an arbitrary value between a voltage value of the drive battery 20 that is exhibited as the potential difference between the two output terminal voltages when both the DC relays 31 and 32 are in the drive state and a substantial zero value that is exhibited as the potential difference between the two output terminal voltages when both the DC relays 31 and 32 are in the open state.

When the controller 12 determines that the potential difference between the output terminal voltage of the positive DC relay 31 and the output terminal voltage of the negative DC relay 32 is smaller than the threshold (Step S504: YES), the process proceeds to Step S505. When the controller 12 determines that the potential difference between the output terminal voltage of the positive DC relay 31 and the output terminal voltage of the negative DC relay 32 is equal to or larger than the threshold (Step S504: NO), the process proceeds to Step S506.

Step S505

The controller 12 determines whether the potential difference between the output terminal voltage of the positive DC relay 31 and the output terminal voltage of the negative DC relay 32 is smaller than the threshold continuously for a second period. This determination is made to determine whether the states of the DC relays 31 and 32 are stable. Therefore, the second period is set to an arbitrary period necessary for determining the states of the DC relays 31 and 32.

When the controller 12 determines that the potential difference between the output terminal voltage of the positive DC relay 31 and the output terminal voltage of the negative DC relay 32 is stably smaller than the threshold continuously for the second period (Step S505: YES), the process proceeds to Step S508. When the controller 12 determines that the potential difference between the output terminal voltage of the positive DC relay 31 and the output terminal voltage of the negative DC relay 32 is not stably smaller than the threshold continuously for the second period (Step S505: NO), the process proceeds to Step S502.

Step S506

The controller 12 determines whether the potential difference between the output terminal voltage of the positive DC relay 31 and the output terminal voltage of the negative DC relay 32 is equal to or larger than the threshold continuously for the second period. This determination is made to determine whether the states of the DC relays 31 and 32 are stable. The second period is described above in Step S505.

When the controller 12 determines that the potential difference between the output terminal voltage of the positive DC relay 31 and the output terminal voltage of the negative DC relay 32 is stably equal to or larger than the threshold continuously for the second period (Step S506: YES), the process proceeds to Step S509. When the controller 12 determines that the potential difference between the output terminal voltage of the positive DC relay 31 and the output terminal voltage of the negative DC relay 32 is not stably equal to or larger than the threshold continuously for the second period (Step S506: NO), the process proceeds to Step S502.

Step S507

The controller 12 determines that determination cannot be made as to whether the positive DC relay 31 is normal or abnormal (impossibility determination). When the controller 12 determines that the determination about the positive DC relay 31 is impossible, the process proceeds to Step S510.

Step S508

The controller 12 determines that the positive DC relay 31 is normal (normality determination). When the controller 12 determines that the positive DC relay 31 is normal, the process proceeds to Step S510.

Step S509

The controller 12 determines that the positive DC relay 31 has the abnormality of sticking closure (abnormality determination). When the controller 12 determines that the positive DC relay 31 is abnormal, the process proceeds to Step S510.

Step S510

The controller 12 controls both the positive DC relay 31 and the negative DC relay 32 into the open state. When the controller 12 controls the positive DC relay 31 and the negative DC relay 32 into the open state, the positive DC relay sticking closure diagnosis is terminated.

Through the positive DC relay sticking closure diagnosis, it is possible to easily determine the contact sticking abnormality of the positive DC relay 31 alone.

(5) Negative DC Relay Sticking Closure Diagnosis

Figure 6:
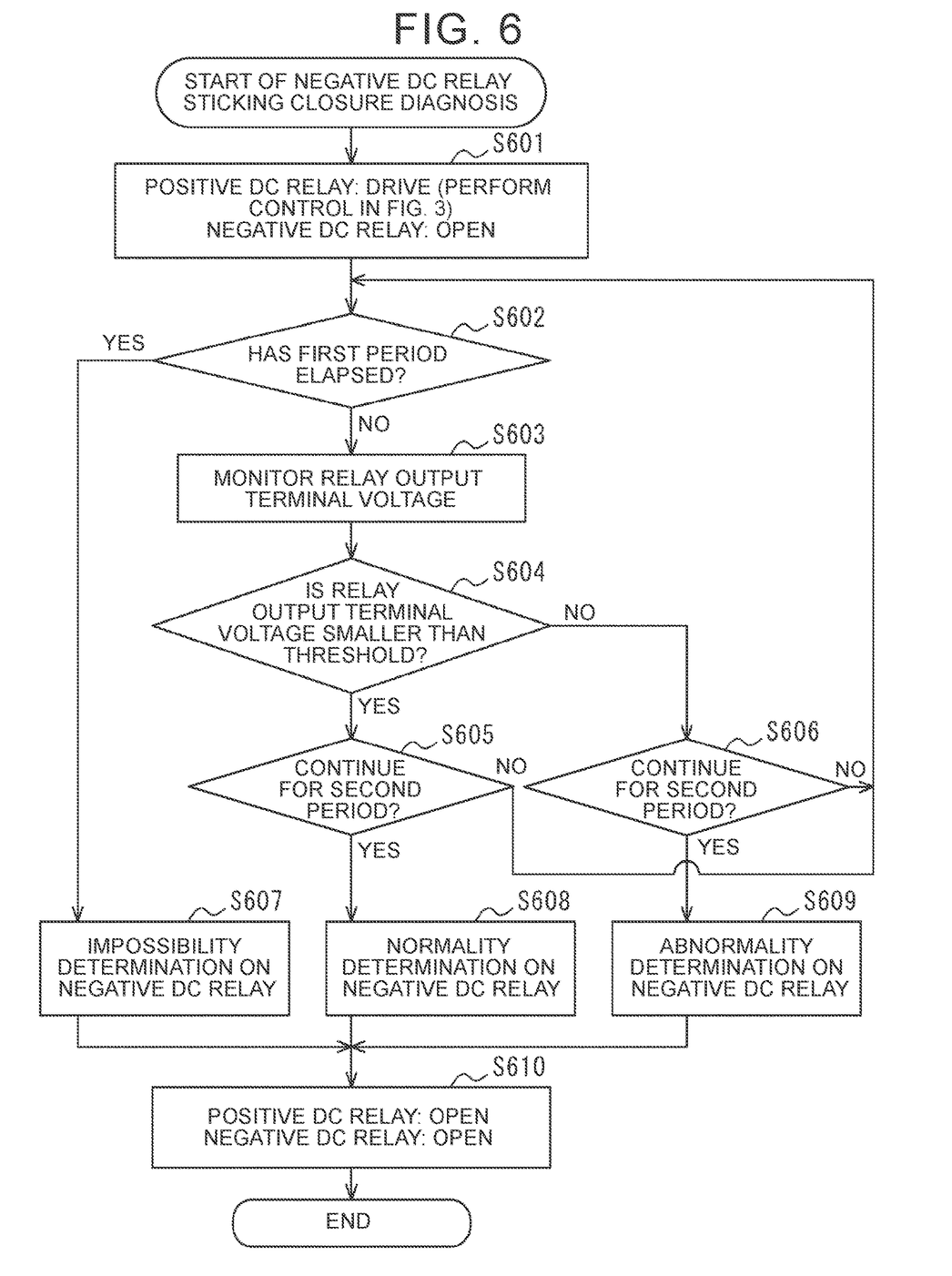
FIG. 6 is a processing flowchart of negative DC relay sticking closure diagnosis.

The negative DC relay sticking closure diagnosis to be performed in Step S403 of FIG. 4 will be described with further reference to FIG. 6. In the negative DC relay sticking closure diagnosis, diagnosis is made as to whether the so-called sticking closure in which the contacts are fused and stuck in the electrically conductive state has occurred in the negative DC relay 32.

Step S601

The controller 12 controls the positive DC relay 31 into the drive state, and controls the negative DC relay 32 into the open state. During this control, the controller 12 performs the relay drive control (FIG. 3) only for the positive DC relay 31 in the drive state. When the controller 12 controls the positive DC relay 31 into the drive state and controls the negative DC relay 32 into the open state, the process proceeds to Step S602.

Step S602

The controller 12 determines whether the first period has elapsed since the operation states of the positive DC relay 31 and the negative DC relay 32 were controlled. This determination is made for the purpose of forcibly terminating the diagnosis when the state of the negative DC relay 32 is not stable and determination cannot be made as to whether it is normal or abnormal. Therefore, the first period may appropriately be set based on, for example, the performance of the charge relay 30 and the charging specifications of the vehicle.

When the controller 12 determines that the first period has elapsed since the operation states of the positive DC relay 31 and the negative DC relay 32 were controlled (Step S602: YES), the process proceeds to Step S607. When the controller 12 determines that the first period has not elapsed since the operation states of the positive DC relay 31 and the negative DC relay 32 were controlled (Step S602: NO), the process proceeds to Step S603.

Step S603

The controller 12 monitors the potential difference between the output terminal voltage of the positive DC relay 31 and the output terminal voltage of the negative DC relay 32. The potential difference between the two output terminal voltages can be acquired from the voltage detector 13. When the controller 12 monitors the potential difference between the two output terminal voltages, the process proceeds to Step S604.

Step S604

The controller 12 determines whether the potential difference between the output terminal voltage of the positive DC relay 31 and the output terminal voltage of the negative DC relay 32 is smaller than the predetermined threshold. This determination is made to determine whether the negative DC relay 32 is in the drive state or in the open state. Therefore, this threshold is set to an arbitrary value between the voltage value of the drive battery 20 that is exhibited as the potential difference between the two output terminal voltages when both the DC relays 31 and 32 are in the drive state and the substantial zero value that is exhibited as the potential difference between the two output terminal voltages when both the DC relays 31 and 32 are in the open state.

When the controller 12 determines that the potential difference between the output terminal voltage of the positive DC relay 31 and the output terminal voltage of the negative DC relay 32 is smaller than the threshold (Step S604: YES), the process proceeds to Step S605. When the controller 12 determines that the potential difference between the output terminal voltage of the positive DC relay 31 and the output terminal voltage of the negative DC relay 32 is equal to or larger than the threshold (Step S604: NO), the process proceeds to Step S606.

Step S605

The controller 12 determines whether the potential difference between the output terminal voltage of the positive DC relay 31 and the output terminal voltage of the negative DC relay 32 is smaller than the threshold continuously for the second period. This determination is made to determine whether the states of the DC relays 31 and 32 are stable. Therefore, the second period is set to an arbitrary period necessary for determining the states of the DC relays 31 and 32.

When the controller 12 determines that the potential difference between the output terminal voltage of the positive DC relay 31 and the output terminal voltage of the negative DC relay 32 is stably smaller than the threshold continuously for the second period (Step S605: YES), the process proceeds to Step S608. When the controller 12 determines that the potential difference between the output terminal voltage of the positive DC relay 31 and the output terminal voltage of the negative DC relay 32 is not stably smaller than the threshold continuously for the second period (Step S605: NO), the process proceeds to Step S602.

Step S606

The controller 12 determines whether the potential difference between the output terminal voltage of the positive DC relay 31 and the output terminal voltage of the negative DC relay 32 is equal to or larger than the threshold continuously for the second period. This determination is made to determine whether the states of the DC relays 31 and 32 are stable. The second period is described above in Step S605.

When the controller 12 determines that the potential difference between the output terminal voltage of the positive DC relay 31 and the output terminal voltage of the negative DC relay 32 is stably equal to or larger than the threshold continuously for the second period (Step S606: YES), the process proceeds to Step S609. When the controller 12 determines that the potential difference between the output terminal voltage of the positive DC relay 31 and the output terminal voltage of the negative DC relay 32 is not stably equal to or larger than the threshold continuously for the second period (Step S606: NO), the process proceeds to Step S602.

Step S607

The controller 12 determines that determination cannot be made as to whether the negative DC relay 32 is normal or abnormal (impossibility determination). When the controller 12 determines that the determination about the negative DC relay 32 is impossible, the process proceeds to Step S610.

Step S608

The controller 12 determines that the negative DC relay 32 is normal (normality determination). When the controller 12 determines that the negative DC relay 32 is normal, the process proceeds to Step S610.

Step S609

The controller 12 determines that the negative DC relay 32 has the abnormality of sticking closure (abnormality determination). When the controller 12 determines that the negative DC relay 32 is abnormal, the process proceeds to Step S610.

Step S610

The controller 12 controls both the positive DC relay 31 and the negative DC relay 32 into the open state. When the controller 12 controls the positive DC relay 31 and the negative DC relay 32 into the open state, the negative DC relay sticking closure diagnosis is terminated.

Through the negative DC relay sticking closure diagnosis, it is possible to easily determine the contact sticking abnormality of the negative DC relay 32 alone. Operations and Effects As described above, in the relay drive control device 10 according to the embodiment of the present disclosure, when the charge relay (CHR) 30 connecting the drive battery 20 and the external power supply 50 is driven for the DC charging, the voltage converter 11 that generates the drive voltage is controlled to increase the drive voltage to the voltage value at which the charge relay 30 can be driven (first voltage value). Then, the drive voltage is supplied to the charge relay 30 at an earlier timing out of the timing when the drive voltage reaches the drivable voltage value (first voltage value) and the timing when the predetermined period elapses since the start of the increase in the drive voltage.

With this control, the first voltage value is set to the voltage value at which the charge relay 30 can be driven at the upper limit value of the predetermined temperature range in which the use of the charge relay 30 is permitted. Thus, the charge relay 30 can appropriately be driven without changing the structure of the relay (the number of turns of the coil in the mechanical relay, the magnetic circuit, etc.) even in the high-temperature environment in which the use of the charge relay 30 is assumed. By providing the time limit based on the predetermined period, the charge relay 30 can be driven early when the temperature of the charge relay 30 is not high.

In the relay drive control device 10 according to the present embodiment, there is no need to newly add a dedicated voltage sensor or a dedicated temperature sensor for the relay drive control. Therefore, it is possible to keep the drive performance of the DC relays 31 and 32 and ensure the reliability and marketability on the DC charging while reducing the cost and scale (size and weight) of the device.

Although the embodiment of the present disclosure has been described above, the present disclosure can be understood as being a relay drive control device, a control method to be executed by a controller of the relay drive control device including a processor and a memory, a control program for executing the control method, a non-transitory computer-readable recording medium that stores the control program, and a vehicle including the relay drive control device.

The relay drive control device of the present disclosure can be used, for example, to control drive of a relay for connecting a battery mounted on a vehicle and an external power supply.

What is claimed is:

1. A relay drive control device configured to control drive of a relay for connecting a battery mounted on a vehicle and an external power supply, the relay drive control device comprising a controller configured to, when driving the relay, supply an output voltage of the battery to the relay after increasing the output voltage to a voltage value at which the relay is drivable.

2. The relay drive control device according to claim 1, further comprising a voltage converter configured to output the output voltage converted into a drive voltage to the controller, wherein:
the output voltage is input from the battery;
the controller is configured to, when driving the relay, control the voltage converter to increase the drive voltage input from the voltage converter to a first voltage value at which the relay is drivable; and
the controller is configured to supply the drive voltage to the relay when the relay is to be driven and the drive voltage reaches the first voltage value.

3. The relay drive control device according to claim 2, wherein the controller is configured to, when the controller has started to control the voltage converter to increase the drive voltage to the first voltage value in a situation in which the relay is to be driven and then a predetermined period has elapsed before the drive voltage reaches the first voltage value, supply the drive voltage to the relay at a timing when the predetermined period has elapsed.

4. The relay drive control device according to claim 3, wherein the controller is configured to change, based on information related to a temperature of the relay, at least one of the predetermined period and a rate of increase in the drive voltage to the first voltage value.

5. The relay drive control device according to claim 2, wherein the controller is configured to control the voltage converter to reduce the drive voltage to a second voltage value after the relay has been driven by supplying the drive voltage to the relay.

6. The relay drive control device according to claim 5, wherein the second voltage value is a voltage value at which the relay that is being driven is not switched to an open state.

7. The relay drive control device according to claim 2, wherein the first voltage value is a voltage value at which the relay is drivable at an upper limit value of a predetermined temperature range in which use of the relay is permitted.

8. The relay drive control device according to claim 2, wherein the controller is configured to determine whether the relay is drivable based on states of the battery and the voltage converter.

9. The relay drive control device according to claim 1, wherein the external power supply is external charging equipment to be plugged into the vehicle to supply electric power to the vehicle.

10. A control method to be executed by a computer of a relay drive control device configured to control drive of a relay for connecting a battery mounted on a vehicle and an external power supply, the control method comprising:
determining whether to drive the relay;
increasing, when driving the relay, an output voltage of the battery to a drive voltage at which the relay is drivable; and
supplying the drive voltage to the relay when the output voltage reaches the drive voltage.

11. A non-transitory storage medium storing instructions that are executable by one or more processors of a computer of a relay drive control device and that cause the one or more processors to perform functions, the relay drive control device being configured to control drive of a relay for connecting a battery mounted on a vehicle and an external power supply, the functions comprising:
determining whether to drive the relay;
increasing, when driving the relay, an output voltage of the battery to a drive voltage at which the relay is drivable; and
supplying the drive voltage to the relay when the output voltage reaches the drive voltage.

* * * * *